(12) United States Patent
Tachibana et al.

(10) Patent No.: US 8,883,249 B2
(45) Date of Patent: Nov. 11, 2014

(54) METHOD OF PRODUCING A PERPENDICULAR MAGNETIC RECORDING MEDIUM

(75) Inventors: Toshiaki Tachibana, Singapore (SG); Takahiro Onoue, Singapore (SG); Keiichi Kajita, Singapore (SG)

(73) Assignee: WD Media (Singapore) Pte. Ltd., Singapore (SG)

( * ) Notice: Subject to any disclaimer, the term of this patent is extended or adjusted under 35 U.S.C. 154(b) by 664 days.

(21) Appl. No.: 12/980,062

(22) Filed: Dec. 28, 2010

(65) Prior Publication Data

US 2011/0206947 A1 Aug. 25, 2011

(30) Foreign Application Priority Data

Dec. 28, 2009 (JP) ................................ 2009-297739

(51) Int. Cl.

| | | |
|---|---|---|
| G11B 5/66 | (2006.01) | |
| H01F 1/06 | (2006.01) | |
| G11B 5/84 | (2006.01) | |
| C23C 14/58 | (2006.01) | |
| G11B 5/65 | (2006.01) | |

(52) U.S. Cl.
CPC .. *G11B 5/66* (2013.01); *H01F 1/06* (2013.01); *G11B 5/65* (2013.01); *G11B 5/84* (2013.01); *C23C 14/5806* (2013.01)
USPC ........... 427/127; 427/130; 427/131; 427/379; 428/827; 428/828; 428/829; 428/828.1

(58) Field of Classification Search
None
See application file for complete search history.

(56) References Cited

U.S. PATENT DOCUMENTS

| | | | |
|---|---|---|---|
| 2002/0028356 A1* | 3/2002 | Kawato et al. ......... | 428/694 TM |
| 2002/0048694 A1* | 4/2002 | Mukai et al. ............ | 428/694 TS |
| 2002/0071966 A1* | 6/2002 | Inomata et al. ........ | 428/694 TM |

(Continued)

FOREIGN PATENT DOCUMENTS

| | | |
|---|---|---|
| JP | 2006-294220 | 10/2006 |
| WO | 2008123445 | 10/2008 |
| WO | 2009044811 | 4/2009 |

OTHER PUBLICATIONS

Office Action dated Dec. 24, 2013 from corresponding Japanese Application No. 2009-297739, filed Dec. 28, 2009, 3 pages.

(Continued)

*Primary Examiner* — Mandy Louie

(57) ABSTRACT

By improving sliding durability while ensuring a high SNR, an improvement in reliability and a further increase in recording density are to be achieved.
The structure of a method of manufacturing a perpendicular magnetic recording medium according to the present invention includes: a main recording layer forming step of forming, on a substrate, at least a main recording layer formed of magnetic particles having a CoCrPt alloy as a main component and a non-magnetic grain boundary part having an oxide as a main component; a split layer forming step of forming a split layer having a Ru alloy or a Co alloy as a main component on the main recording layer; a first heating step of performing a heat treatment on the substrate after the split layer forming step; an auxiliary recording layer forming step of forming an auxiliary recording layer formed of a material having CoCrPt as a main component after the first heating step; a second heating step of performing a heat treatment on the substrate after the auxiliary recording layer forming step; and a protective layer forming step of forming a protective layer having carbon as a main component by CVD after the second heating step.

8 Claims, 2 Drawing Sheets

| | | FIRST EXAMPLE | SECOND EXAMPLE | THIRD EXAMPLE | FOURTH EXAMPLE | FIRST COMPARATIVE EXAMPLE | SECOND COMPARATIVE EXAMPLE | THIRD COMPARATIVE EXAMPLE |
|---|---|---|---|---|---|---|---|---|
| RATIO OF HEAT QUANTITY (%) | SECOND HEATING PROCESS (AFTER AUXILIARY RECORDING LAYER FORMING PROCESS AND BEFORE PROTECTIVE LAYER FORMING PROCESS) | 90 | 80 | 70 | 100 | 100 | 90 | 90 |
| | FIRST HEATING PROCESS (AFTER SPLIT LAYER FORMING PROCESS AND BEFORE AUXILIARY RECORDING LAYER FORMING PROCESS) | 10 | 20 | 30 | 10 | 0 | 0 | 0 |
| | HEATING PROCESS BEFORE FORMATION OF SPLIT LAYER | 0 | 0 | 0 | 0 | 0 | 10 | 0 |
| | HEATING BEFORE FORMATION OF MAIN RECORDING LAYER | 0 | 0 | 0 | 0 | 0 | 0 | 10 |
| | TOTAL HEAT QUANTITY | 100 | 100 | 100 | 110 | 100 | 100 | 100 |
| PinOn TEST (NUMBER OF TIMES) | | 330 | 340 | 340 | 345 | 300 | 320 | 300 |
| SNR(dB) | | 15.1 | 15.0 | 14.9 | 14.9 | 14.9 | 14.7 | 14.5 |

(56) References Cited

U.S. PATENT DOCUMENTS

| | | |
|---|---|---|
| 2003/0082410 A1* | 5/2003 | Sato et al. ............... 428/694 EC |
| 2005/0053803 A1* | 3/2005 | Umeda et al. ............... 428/694 T |
| 2005/0106314 A1* | 5/2005 | Ono et al. ..................... 427/127 |
| 2005/0153169 A1* | 7/2005 | Watanabe et al. ...... 428/694 BM |
| 2007/0111036 A1* | 5/2007 | Ito et al. ........................ 428/829 |

OTHER PUBLICATIONS

Office Action with English Translation dated Dec. 24, 2013 from corresponding Japanese Application No. 2009-297739, filed Dec. 28, 2009, 6 pages.

* cited by examiner

FIG. 2

| | | FIRST EXAMPLE | SECOND EXAMPLE | THIRD EXAMPLE | FOURTH EXAMPLE | FIRST COMPARATIVE EXAMPLE | SECOND COMPARATIVE EXAMPLE | THIRD COMPARATIVE EXAMPLE |
|---|---|---|---|---|---|---|---|---|
| RATIO OF HEAT QUANTITY (%) | SECOND HEATING PROCESS (AFTER AUXILIARY RECORDING LAYER FORMING PROCESS AND BEFORE PROTECTIVE LAYER FORMING PROCESS) | 90 | 80 | 70 | 100 | 100 | 90 | 90 |
| | FIRST HEATING PROCESS (AFTER SPLIT LAYER FORMING PROCESS AND BEFORE AUXILIARY RECORDING LAYER FORMING PROCESS) | 10 | 20 | 30 | 10 | 0 | 0 | 0 |
| | HEATING PROCESS BEFORE FORMATION OF SPLIT LAYER | 0 | 0 | 0 | 0 | 0 | 10 | 0 |
| | HEATING BEFORE FORMATION OF MAIN RECORDING LAYER | 0 | 0 | 0 | 0 | 0 | 0 | 10 |
| | TOTAL HEAT QUANTITY | 100 | 100 | 100 | 110 | 100 | 100 | 100 |
| PinOn TEST (NUMBER OF TIMES) | | 330 | 340 | 340 | 345 | 300 | 320 | 300 |
| SNR(dB) | | 15.1 | 15.0 | 14.9 | 14.9 | 14.9 | 14.7 | 14.5 |

METHOD OF PRODUCING A PERPENDICULAR MAGNETIC RECORDING MEDIUM

TECHNICAL FIELD

The present invention relates to a method of manufacturing a perpendicular magnetic recording medium to be mounted an HDD (hard disk drive) or the like of a perpendicular magnetic recording type.

BACKGROUND ART

With an increase in capacity of information processing in recent years, various information recording technologies have been developed. In particular, the surface recording density of an HDD using magnetic recording technology is continuously increasing at an annual rate of approximately 100%. In recent years, an information recording capacity exceeding 320 gigabytes/platter with a 2.5-inch diameter of a perpendicular magnetic recording medium for use in an HDD or the like has been desired. To fulfill such demands, an information recording density exceeding 500 gigabits/inch square is desired to be achieved.

To attain a high recording density in a magnetic recording medium for use in an HDD or the like, a perpendicular magnetic recording type has been suggested in recent years. In a perpendicular magnetic recording medium for use in the perpendicular magnetic recording type, the axis of easy magnetization of a recording layer is adjusted so as to be oriented in a direction perpendicular to the base surface. In the perpendicular magnetic recording type, compared with a conventional in-plane recording type, it is possible to more suppress a so-called thermal fluctuation phenomenon, in which thermal stability of a recording signal is impaired because of a superparamagnetic phenomenon to cause the recording signal to be lost, and therefore the perpendicular magnetic recording type is suitable for increasing the recording density.

Various important factors for increasing recording density of the perpendicular magnetic recording medium include an improvement in magnetostatic characteristic, such as a coercive force Hc and a reversed magnetic domain nucleation magnetic field Hc; an improvement in electromagnetic conversion characteristic, such as an overwrite characteristic (OW characteristic) and an SNR (Signal to Noise Ratio); and narrowing of a track width. Among all, an improvement in coercive force Hc and an improvement in SNR are important for reading and writing accurately at high speed even at a recording bit of a small area.

An improvement in SNR is achieved mainly by reducing noise in a magnetization transition region of the magnetic recording layer. Effective factors for reducing noise include an improvement in crystal orientation of the magnetic recording layer, making a finer particle diameter of each magnetic particle, and isolation of the magnetic particles. Among all, making a finer particle diameter is effective at reducing noise in the magnetization transition region of a boundary of recording bits.

Also in recent years, magnetic recording medium devices are often used not only for a conventional purpose as storage devices for personal computers but also for mobile purposes such as portable telephones and car navigation systems. With such diversification of use purposes, reliability under harsh environments and a further improvement in recording and reproducing characteristic have become problems in magnetic recording media.

To solve the problems above, for example, Patent Document 1 discloses a method of manufacturing a magnetic recording medium in which after a heating process of heating a substrate where a magnetic recording layer is formed is performed, a protective film forming process of forming a carbon protective film by plasma CVD is performed. According to the method described in Patent Document 1, a perpendicular magnetic recording medium having an excellent recording and reproducing characteristic can be obtained, and also a dense carbon protective film excellent in adhesiveness can be formed. Therefore, a magnetic recording medium having such a recording and reproducing characteristic and reliability both can be provided.

PRIOR ART DOCUMENT

Patent Document

[Patent Document 1] Japanese Unexamined Patent Application Publication No. 2006-294220

DISCLOSURE OF INVENTION

Problems to be Solved by the Invention

As described above, by performing a heat treatment before forming a carbon protective film (hereinafter referred to as a protective layer), it is possible to improve denseness, adhesiveness, and others of the carbon protective layer to increase sliding durability and improve the recording and reproducing characteristic and reliability. However, to address further diversification of use purposes, a further improvement in recording and reproducing characteristic and reliability is required, which is difficult to achieve only by using the technology described in Patent Document 1 above.

Moreover, another problem is that it has been apparent that, when the substrate is heated at high temperature as in Patent Document 1 above, due to an adverse effect on the recording layer having a granular structure, a decrease in magnetostatic characteristic and electromagnetic conversion characteristic, among others, a decrease in SNR, is invited. For this reason, in the technology described in Patent Document 1 above, by heating the substrate, the SNR is decreased to constitute a hindrance to increase recording density, although sliding durability is improved. That is, there is a problem that the heating temperature should not be unnecessarily increased even when sliding durability is desired to be increased.

In view of these problems, an object of the present invention is to provide a method of manufacturing a perpendicular magnetic recording medium capable of achieving an improvement in reliability and a further increase in recording density by improving sliding durability while ensuring a high SNR.

Means for Solving the Problem

To solve the problems above, as a result of diligent studies by the inventors, it was found that sliding durability is improved by improving flatness of a layer immediately below the protective layer. And, as a result of further studies, it was found that, in film formation by sputtering, the layer can be planarized by heating in advance. Also, with close investigations by the inventors on a magnetic recording medium subjected to a heat treatment in advance, it turned out that an adverse effect due to the heat treatment, that is, a decrease in magnetostatic characteristic and electromagnetic conversion characteristic or the like, becomes significant as the temperature of the substrate increases. Therefore, the inventors have thought that, by optimizing the heat temperature to suppress an abrupt and excessive increase in temperature of the substrate, a decrease in characteristic can be suppressed, and have completed the present invention.

That is, to solve the problems above, in a typical structure of a method of manufacturing a perpendicular magnetic recording medium according to the present invention includes: a main recording layer forming process of forming, on a substrate, at least a main recording layer formed of magnetic particles having a CoCrPt alloy as a main component and a non-magnetic grain boundary part having an oxide as a main component; a split layer forming process of forming a split layer having a Ru alloy or a Co alloy as a main component on the main recording layer; a first heating process of performing a heat treatment on the substrate after the split layer forming process; an auxiliary recording layer forming process of forming an auxiliary recording layer formed of a material having CoCrPt as a main component after the first heating process; a second heating process of performing a heat treatment on the substrate after the auxiliary recording layer forming process; and a protective layer forming process of forming a protective layer having carbon as a main component by CVD after the second heating process.

According to the structure above, the auxiliary recording layer formed after the first heating process can be planarized. Therefore, since the protective layer is formed on the flatter layer, sliding durability of the protective layer can be improved. Also, the first heating process is performed after a split layer is formed on the main recording layer. With this split layer, the main recording layer can be suitably protected from an adverse effect due to a heat treatment.

Furthermore, in the structure above, the heat treatment is performed as being split into two, that is, the first heating process and the second heating process. That is, while the heat quantity to be supplied to the substrate in the second heating process is smaller than the heat quantity in the first heating process, the same total heat quantity as the conventional one can be supplied to the substrate. With this, unlike the heating process conventionally performed after the protective film forming process, a large amount of heating is not required to be applied at one time. Therefore, an abrupt and excessive increase in temperature of the substrate can be suppressed, and an adverse effect on the main recording layer due to a heat treatment can be further decreased, thereby ensuring a high SNR. Still further, by making adjustment so that the total heat quantity in the first heating process and the second heating process is equal to the conventional heat quantity in the conventional heating process, a further improvement in sliding durability by planarization can be achieved while the effect of the improvement in sliding durability due to heat approximately equivalent to the conventional effect is obtained. Therefore, since sliding durability can be improved while a high SNR is ensured, an improvement in reliability and a further increase in recording density can be achieved.

Note that a "main component" in the present application means that the component occupies at least 50% or more when the entire composition is taken as at % (or mol %). For example, when the case of a composition of 90(Co—Cr—Pt)-10($SiO_2$) is considered, the CoCrPt alloy is a main component because it occupies 90% of the whole.

The heat quantity to be supplied to the substrate in the first heating process is preferably smaller than that in the second heating process. With this, the temperature of the substrate is not extremely increased, thereby eliminating an adverse effect on the main recording layer due to the heat treatment at the time of the first heating process.

When a sum of the heat quantity to be supplied to the substrate in the first heating process and the heat quantity to be supplied to the substrate in the second heating process described above is taken as a total heat quantity, the heat quantity at the time of the first heating process is preferably 10% to 20% of the total heat quantity.

With this structure, the above effects can be most suitably obtained. Note that when a heat quantity at the time of the first heating process smaller than the lower limit value described above is not preferable because planarization of the auxiliary recording layer to be formed thereafter cannot be sufficiently performed. Also, a heat quantity at the time of the first heating process exceeding the upper limit value described above is not preferable because the heat quantity becomes excessive to increase an adverse effect on the main recording layer.

Effect of the Invention

According to the present invention, by improving sliding durability while ensuring a high SNR, a method of manufacturing a perpendicular magnetic recording medium capable of achieving an improvement in reliability and a further increase in recording density can be provided.

BRIEF DESCRIPTION OF DRAWINGS

FIG. 2 A drawing depicting PinOn test results and changes in SNR according to the structures of examples and comparative examples.

BEST MODE FOR CARRYING OUT THE INVENTION

Figure 1:
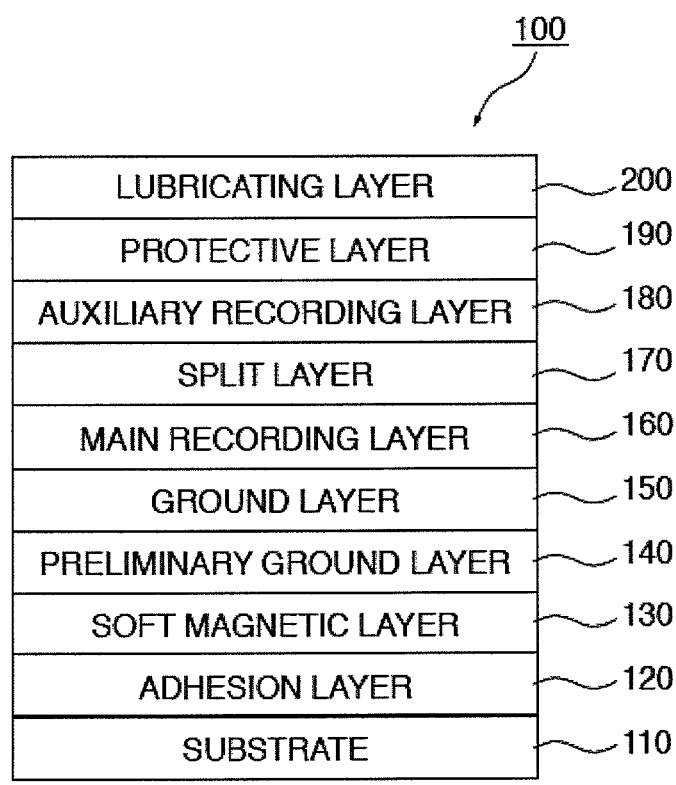
FIG. 1 A drawing for describing the structure of a perpendicular magnetic recording medium 100 according to an embodiment.

In the following, with reference to the attached drawings, a preferred embodiment of the present invention is described in detail. The dimensions, materials, and others such as specific numerical values shown in this embodiment are merely examples so as to facilitate understanding of the invention, and are not meant to restrict the present invention unless otherwise specified. Note that, in the specification and drawings, components having substantially the same functions and structures are provided with the same reference characters and are not redundantly described, and components not directly relating to the present invention are not shown in the drawings.

(Method of Manufacturing Perpendicular Magnetic Recording Medium)

FIG. 1 is a drawing for describing the structure of a perpendicular magnetic recording medium 100 according to the present embodiment. The perpendicular magnetic recording medium 100 depicted in FIG. 1 includes a substrate 110, an adhesion layer 120, a soft magnetic layer 130, a preliminary ground layer 140, a ground layer 150, a main recording layer 160, a split layer 170, an auxiliary recording layer 180, a protective layer 190, and a lubricating layer 200.

As the substrate 110, a glass disk formed by molding an amorphous aluminosilicate glass in a disk form by direct pressing can be used, for example. Note that the type, size, thickness, and others of the glass disk are not particularly restrictive. As a material of the glass disk, for example, an aluminosilicate glass, a soda lime glass, a soda aluminosilicate glass, an aluminoborosilicate glass, a borosilicate glass, a quartz glass, a chain silicate glass, or a glass ceramic, such as a crystallized glass, is used. On this glass disk, grinding, polishing, and chemical strengthening are sequentially performed, and the smooth non-magnetic substrate 110 formed of the chemically-strengthened glass disk can be obtained.

On the substrate 110, the adhesion layer 120 to the auxiliary recording layer 180 are sequentially formed by DC magnetron sputtering, and the protective layer 190 can be formed by CVD. Then, the lubricating layer 200 can be formed by dip coating. The structure of each layer is described below.

The adhesion layer 120 is formed in contact with the substrate 110, including a function of increasing an adhesive strength between the soft magnetic layer 130 and the substrate 110 formed on the adhesion layer. For example, the adhesion layer 120 is preferably an amorphous alloy film, such as a CrTi-type amorphous alloy, a CoW-type amorphous alloy, a CrW-type amorphous alloy, a CrTa-type amorphous alloy, or a CrNb-type amorphous alloy. The film thickness of the adhesion layer 120 can be on the order of 2 nm to 20 nm, for example. The adhesion layer 120 may be a monolayer, or may be formed by laminating a plurality of layers.

When a signal is recorded in a perpendicular magnetic recording type, the soft magnetic layer 130 has an operation of helping ease of writing a signal to the magnetic recording layer and high density by converging a write magnetic field from a head. As a soft magnetic material, a material showing a soft magnetic characteristic can be used, including a cobalt-type alloy such as CoTaZr; a FeCo-type alloy such as FeCoCrB, FeCoTaZr, or FeCoNiTaZr; and a NiFe-type alloy. Also, by interposing a spacer layer made of Ru to about the midpoint of the soft magnetic layer 130, it can be configured to have an AFC (Antiferro-magnetic exchange coupling). With this, the number of vertical components of magnetization can be extremely decreased, thereby reducing noise occurring from the soft magnetic layer 130. In the case of the structure in which a spacer layer is interposed, as for the film thickness of the soft magnetic layer 130, a spacer layer can be on the order of 0.3 nm to 0.9 nm, and upper and lower layers of a soft magnetic material can be each on the order of 10 nm to 50 nm.

The preliminary ground layer 140 includes a function of promoting crystal orientation of the ground layer 150 formed thereabove and a function of controlling a fine structure of a grain diameter and others. The preliminary ground layer 140 may have an hcp structure, but preferably has a face-centered cubic structure (fcc structure) in which a (110) surface is oriented so as to be parallel to a main surface of the substrate 110. As a material of the preliminary ground layer 140, for example, Ni, Cu, Pt, Pd, Ru, Co, or Hf can be used, and, furthermore, an alloy having any of these metals as a main component and having one or more of V, Cr, Mo, W, Ta, and others added thereto can be used. Specifically, NiV, NiCr, NiTa, NiW, NiVCr, CuW, CuCr, or others can be suitably selected. The film thickness of the preliminary ground layer 140 can be on the order of 1 nm to 20 nm. Also, the preliminary ground layer 140 may have a structure of a plurality of layers.

The ground layer 150 has an hcp structure, has a function of promoting crystal orientation of magnetic crystal grains having an hcp structure of the main recording layer 160 formed thereabove and a function of controlling a fine structure of a grain diameter and others, and servers as a base layer for a granular structure of the main recording layer. Ru has an hcp structure identical to that of Co, and has a crystal grating spacing close to Co. Thus, magnetic grains having Co as a main component can be nicely oriented. Therefore, as the crystal orientation of the ground layer 150 is higher, the crystal orientation of the main recording layer 160 can be more improved. Also, by making the particle diameter of the ground layer 150 finer, the particle diameter of the main recording layer can be made finer. As a material of the ground layer 150, Ru is typical, but a metal, such as Cr or Co, or an oxide can be added. The film thickness of the ground layer 150 can be on the order of 5 nm to 40 nm, for example.

Also, by changing a gas pressure at the time of sputtering, the ground layer 150 may have a two-layer structure. Specifically, when an upper layer side of the ground layer 150 is formed, if a gas pressure of Ar is higher than that when a lower layer side is formed, the particle diameter of magnetic grains can be made finer while crystal orientation of the main recording layer 160 thereabove is nicely kept.

The main recording layer 160 has a columnar granular structure in which a non-magnetic substance having an oxide as a main component is subjected to segregation around ferromagnetic particles having a Co—Pt-type alloy as a main component to form a grain boundary. For example, by forming a film with the use of a target formed by mixing $SiO_2$, $TiO_2$, or the like into a CoCrPt-type alloy, a non-magnetic substance, such as $SiO_2$ or $TiO_2$, is subjected to segregation around magnetic particles (grains) formed of the CoCrPt-type alloy to form a grain boundary, and a granular structure in which the magnetic particles grows in a columnar shape can be formed (main recording layer forming process).

Note that the substance for use as the main recording layer 160 described above is merely an example and is not meant to be restrictive. A non-magnetic substance for forming a grain boundary can be exemplified by an oxide, for example, any of silicon oxide ($SiO_2$), titanium oxide ($TiO_2$), chromium oxide ($Cr_2O_3$), zircon oxide ($ZrO_2$), tantalum oxide ($Ta_2O_3$), cobalt oxide (CoO or $CO_3O_4$), and others. Also, not only an oxide of one type but oxides of two or more types can be combined for use together.

The split layer 170 is formed between the main recording layer 160 and the auxiliary recording layer 180 (split layer forming process). The split layer 170 has an operation of adjusting the strength of an exchange coupling between these layers. With this, the strength of magnetic coupling between adjacent magnetic particles between 160 and the auxiliary recording layer 180 and in the main recording layer 160 can be adjusted. Thus, the recording and reproducing characteristic, such as the overwrite characteristic and the SNR characteristic, can be improved while magnetostatic values relating to resistance to thermal fluctuations, such as Hc and Hn, is kept.

The split layer 170 is preferably a layer having Ru or Co as a main component with an hcp crystal structure in order to prevent a decrease in inheritance of crystal orientation. As a Ru-type material, other than Ru, a substance formed by adding another metal element or oxygen or an oxide to Ru can be used. Also, as a Co-type material, a CoCr alloy can be used. As specific examples, Ru, RuCr, RuCo, Ru—$SiO_2$, Ru—$WO_3$, Ru—$TiO_2$, CoCr, CoCr—$SiO_2$, CoCr—$TiO_2$, and others can be used. Note that a non-magnetic material is normally used as the split layer 170 but may have weak magnetism. Furthermore, to obtain an excellent exchange coupling strength, the film thickness of the split layer 170 is preferably within a range of 0.2 nm to 1.0 nm.

An operation to the structure of the split layer 170 is to promote separation of crystal grains on its upper layer. For example, even when the upper layer is made of a material not containing a non-magnetic substance forming a grain boundary, such as CoCrPt, a grain boundary of magnetic crystal particles can be clarified. Note that, to obtain an excellent exchange coupling strength, the film thickness of the split layer 170 is preferably within a range of 0.2 nm to 1.0 nm.

And, in the present embodiment, the substrate 110 is subjected to a heat treatment after the split layer forming process as described above (first heating process). With this, the auxiliary recording layer 180 to be formed after heating can be planarized, thereby mitigating its surface roughness. Therefore, the protective layer 190 is formed on the more planarized layer (auxiliary recording layer 180), thereby improving sliding durability of the protective layer 190. Here, by heating after the split layer 170 is formed, the main recording layer 160 can be suitably protected from an adverse effect due to a heat treatment at the time of the first heating process.

Note that in the first heating process, an adjustment is preferably made so that the heat quantity to be supplied to the substrate 110 is smaller than that in a second heating process, which will be described further below. With this, an extreme increase in temperature of the substrate at the time of the first heating process can be prevented, and an adverse effect on the main recording layer 160 due to the heat treatment can be eliminated.

Also, when a sum of heat quantities to be supplied to the substrate in the first heating process and the second heating process is taken as a total heat quantity, the heat quantity to be supplied to the substrate in the first heating process above is preferably 10% to 20% of the total heat quantity. With this, the auxiliary recording layer 180 can be sufficiently planarized while an adverse effect on the main recording layer 160 is suppressed, thereby allowing the effect described above to be most suitably obtained.

The auxiliary recording layer 180 is formed on the main recording layer 160 via the split layer 170 (auxiliary recording layer forming process). The auxiliary recording layer 180 is a magnetic layer that approximately continuous magnetically in an in-plane direction of the main surface of the substrate. Since the auxiliary recording layer 180 has a magnetic interaction (an exchange coupling) with respect to the main recording layer 160, a magnetostatic characteristic, such as a coercive force Hc and a reversed magnetic domain nucleation magnetic field Hn, can be adjusted. With this, an object is to improve the resistance to heat fluctuations, OW characteristic, and SNR. As a material of the auxiliary recording layer 180, a CoCrPt-type alloy can be used. Furthermore, an additive, such as B, Ta, or Cu, may be added. Specifically, CoCrPt, CoCrPtB, CoCrPtTa, CoCrPtCu, CoCrPtCuB, and others can be used. Also, a slight amount of oxide can be contained in the substance described above for configuration. The film thickness of the auxiliary recording layer 180 can be 3 nm to 10 nm, for example.

Note that "continuous magnetically" means that magnetism continues without interruption, and "approximately continuous" means that the auxiliary recording layer 180 is not necessarily a single magnet when observed as a whole and the magnetism may be partially discontinuous. That is, the auxiliary recording layer 180 can have any magnetism as long as it is continuous so as to go across (cover) an aggregate of a plurality of magnetic particles. As long as this condition is satisfied, the auxiliary recording layer 180 may have a structure in which, for example, Cr is subjected to segregation. Furthermore, a slight amount of oxide may be contained for segregation.

And, after the auxiliary recording layer 180 is formed as described above and immediately before a protective layer forming process is performed, the substrate 110 is subjected to a heat treatment (second heating process). Therefore, the heating process conventionally performed only immediately before the protective layer forming process is performed as being split into two, that is, the first heating process and the second heating process, in the present embodiment. In this manner, by performing a heat treatment in advance in the first heating process, the heat quantity to be supplied to the substrate in the second heating process can be decreased by the heat quantity in the first heating process. Therefore, unlike in the conventional heating process, applying a large amount of heat at one time is not required, thereby suppressing an abrupt and excessive increase in temperature of the substrate, reducing an adverse effect on the main recording layer due to the heat treatment, and ensuring a high SNR.

Also, even if the heating process is split into a plurality of times, the total heat quantity in the first heating process and the second heating process is adjusted so as to be equal to the heat quantity of the conventional heating process. Specifically, a heat quantity (temperature or amount of current of a heater) from which an optimum Dh/Gh can be obtained is obtained in a protective layer is first found, and is taken as a total amount to be split for the first heating process and the second heating process. With this, sliding durability can be further improved by planarization while an effect of improving sliding durability by heat approximately equivalent to that of the conventional technology is obtained. Therefore, by performing two heating processes (the first heating process and the second heating process), sliding durability can be improved while a high SNR is ensured, thereby achieving an improvement in reliability and a further increase in recording density.

The protective layer 190 is a film for protecting the perpendicular magnetic recording medium 100 from a shock of a magnetic head. The protective layer 190 can be formed by forming a film containing carbon by CVD (protective layer forming process). In general, a carbon film formed by CVD has a film hardness improved compared with a film formed by sputtering, and therefore is suitable because it can protect the perpendicular magnetic recording medium 100 more effectively from a shock of the magnetic head. The film thickness of the protective layer 190 can be 2 nm to 6 nm, for example.

The lubricating layer 200 is formed to prevent damage to the protective layer 190 when the magnetic head makes contact with the surface of the perpendicular magnetic recording medium 100. For example, PFPE (perfluoropolyether) can be applied by dip coating for film formation. The film thickness of the lubricating layer 200 can be 0.5 nm to 2.0 nm, for example.

Examples

To confirm effectiveness of the method of manufacturing the above-structured perpendicular magnetic recording medium 100, description is made by using the following examples and comparative examples.

As an example, on the substrate 110, by using a vacuumed film forming device, the adhesion layer 120 to the auxiliary recording layer 132 were sequentially formed in an Ar atmosphere by DC magnetron sputtering. Note that an Ar gas pressure at the time of film formation is 0.6 Pa unless otherwise specified. As the adhesion layer 120, a 10-nm film of Cr-50Ti was formed. As the soft magnetic layer 130, 20-nm films of 92(40Fe-60Co)-3Ta-5Zr were each formed between which a Ru layer of 0.7 nm was interposed. As the preliminary ground layer 140, an 8-nm film of Ni-5W was formed. As the ground layer 150, a 10-nm film made of Ru was formed at 0.6 Pa, on which a 10-nm film made of Ru was formed at 5 Pa. As the main recording layer 160, a 2-nm film of 90(70Co-10Cr-20Pt)-10($Cr_2O_2$) was formed, on which a 12-nm film of 90(72Co-10Cr-18Pt)-5($SiO_2$)-5($TiO_2$) was formed at 3 Pa.

As the split layer 170, a 0.3-nm made of Ru was formed. After formation of the split layer 170, the first heating process was performed to perform a heat treatment on the substrate 110. As the auxiliary recording layer 180, a 6-nm film of 62Co-18Cr-15Pt-5B was formed. After formation of the auxiliary recording layer 180 and before formation of the protective layer 190, the second heating process was performed to perform a heat treatment on the substrate 110. As the protective layer 190, a film was formed by CVD with the use of $C_2H_4$, and its surface layer was subjected to a nitriding process. As the lubricating layer 200, a film was formed by dip coating with the use of PFPE. Note that various conditions in the first heating process and the second heating process will be described below in detail.

FIG. 2 is a drawing depicting PinOn test results and changes in SNR in a recording and reproducing test according to the structures of the examples and comparative examples. A PinOn test is a test for evaluating sliding durability, in which the perpendicular magnetic recording medium is rotated while a ball made of $Al_2O_3$—TiC and having a diameter of 2 mm is being pressed at a position of a radius of 22 mm of the perpendicular magnetic recording medium with a 15-g load, thereby relatively and rotatably sliding the $Al_2O_3$—TiC ball and the protective layer 190 at a speed of 2 m/sec. Then, the number of sliding rotation until the protective layer 190 is destroyed due to this sliding is measured. It can be evaluated that, as the number is higher, the durability of the protective layer 190 is stronger and reliability of the perpendicular magnetic recording medium is higher.

In FIG. 2, a first example shows the case in which a ratio of heat quantity to be supplied to the substrate in the first heating process and the second heating process was set at 1:9, a second example shows the case in which the ratio was set at 2:8, and a third example shows the case in which the ratio was set at 3:7. A fourth example shows the case in which the same amount of heat was applied as that in the second heating process, and heat was additionally added also in the first heating process. A first comparative example shows the case in which, as in the conventional technology, a heating process was performed only immediately before formation of the protective layer, that is, only the second heating process was performed. A second comparative example shows the case in which a heating process was performed not only in the second heating process but before formation of the split layer. A third comparative example shows the case in which a heating process is performed not only in the second heating process but before formation of the main recording layer.

Note that, as in the first to second examples and the second to fourth comparative examples, the total heat quantity when the heating process is performed a plurality of times was adjusted so as to be equivalent to the heat quantity of the first comparative example in which only the heating process immediately before formation of the protective layer is performed as in the conventional technology. However, only in the fourth example, a heat quantity larger than that in the first comparative example was added. Therefore, in the following description, the first comparative example is taken as a reference for performance evaluation, and superiority or inferiority of other examples with respect to this first comparative example is described in detail.

With reference to the first example and the second and third comparative examples depicted in FIG. 2, when a heating process is performed before formation of the split layer as in the second comparative example and a heating process is performed before formation of the main recording layer as in the third comparative example, it can be found that a decrease in SNR occurs. The reason for this is thought that an adverse effect occurs to the main recording layer 160 because the position of the heating process for the first time is improper. From this, it can be understood that the first heating process after formation of the split layer 170 is suitable.

Also, with reference to the first example and the first comparative example, by performing the heating process as being split into two times as in the first example, it can be found that the protective layer 190 can withstand sliding a number of times more than that when the heating process before formation of the protective layer is performed as in the first comparative example as the conventional technology. With this, it can be found that sliding durability can be further improved.

Furthermore, from the first to third examples, regarding the total heat quantity, it can be found that there is a tendency that sliding durability improves as the ratio of a heat quantity in the first heating process increases and the SNR increases as the ratio of a heat quantity in the second heating process. The reason for this can be thought that, as the heat quantity at the time of the first heating process increases, an adverse effect on the main recording layer 160 increases. Therefore, it can be understood that the heat quantity at the time of the first heating process is suitably 10% to 20% of a total heat quantity (a sum of the heat quantity at the time of the first heating process and the heat quantity at the time of the second heating process).

Also in the fourth embodiment, compared with the first comparative example, sliding durability is dramatically improved. The reason for this can be thought that, by heating in the first heating process in advance, heat is sufficient at the time of formation of the protective layer. Note that the SNR is not different from that in the first comparative example because an adverse effect on the main recording layer 160 is approximately equivalent to that in the first comparative example due to a large total heat quantity. However, if a high sliding durability can be achieved while an approximately equivalent SNR is kept, this technology can be sufficiently valuable for use.

In the foregoing, the preferred embodiment of the present invention has been described with reference to the attached drawings. Needless to say, however, the present invention is not restricted by this embodiments. It is clear that the person skilled in the art can conceive various modification examples or corrected examples within a range described in the scope of claims for patent, and it is understood that these examples reasonably belong to the technological scope of the present invention.

INDUSTRIAL APPLICABILITY

The present invention can be utilized as a method of manufacturing a perpendicular magnetic recording medium to be mounted on an HDD (hard disk drive) or the like of a perpendicular magnetic recording type.

DESCRIPTION OF REFERENCE NUMERALS

100 . . . perpendicular magnetic recording medium, 110 . . . substrate, 120 . . . adhesion layer, 130 . . . soft magnetic layer, 140 . . . preliminary ground layer, 150 . . . ground layer, 160 . . . main recording layer, 170 . . . split layer, 180 . . . auxiliary recording layer, 190 . . . protective layer, 200 . . . lubricating layer

The invention claimed is:
1. A method of manufacturing a perpendicular magnetic recording medium, the method comprising:
a main recording layer forming step of forming, on a substrate, at least a main recording layer formed of magnetic particles having a CoCrPt alloy as a main component and a non-magnetic grain boundary part having an oxide as a main component;

a split layer forming step of forming a split layer having a Ru alloy as a main component on the main recording layer;

a first heating step of performing a heat treatment on the substrate after the split layer forming step;

an auxiliary recording layer forming step of forming on the split layer an auxiliary recording layer formed of a material having CoCrPt as a main component after the first heating step;

a second heating step of performing a heat treatment on the substrate after the auxiliary recording layer forming step; and a protective layer forming step of forming on the auxiliary layer a protective layer having carbon as a main component by chemical vapor deposition after the second heating step.

2. A method of manufacturing a perpendicular magnetic recording medium, the method comprising:

a main recording layer forming step of forming, on a substrate, at least a main recording layer formed of magnetic particles having a CoCrPt alloy as a main component and a non-magnetic grain boundary part having an oxide as a main component;

a split layer forming step of forming a split layer having a Ru alloy as a main component on the main recording layer;

a first heating step of performing a heat treatment on the substrate after the split layer forming step;

an auxiliary recording layer forming step of forming on the split layer an auxiliary recording layer formed of a material having CoCrPt as a main component after the first heating step;

a second heating step of performing a heat treatment on the substrate after the auxiliary recording layer forming step; and a protective layer forming step of forming on the auxiliary layer a protective layer having carbon as a main component by chemical vapor deposition after the second heating step, wherein, when a sum of a heat quantity to be supplied to the substrate in the first heating step and a heat quantity to be supplied to the substrate in the second heating step is taken as a total heat quantity, the heat quantity at the time of the first heating step is 10% to 20% of the total heat quantity.

3. A method of manufacturing a perpendicular magnetic recording medium, the method comprising:

a main recording layer forming step of forming, on a substrate, at least a main recording layer formed of magnetic particles having a CoCrPt alloy as a main component and a non-magnetic grain boundary part having an oxide as a main component;

a split layer forming step of forming a split layer having RuCo as a main component on the main recording layer;

a first heating step of performing a heat treatment on the substrate after the split layer forming step;

an auxiliary recording layer forming step of forming on the split layer an auxiliary recording layer formed of a material having CoCrPt as a main component after the first heating step;

a second heating step of performing a heat treatment on the substrate after the auxiliary recording layer forming step; and a protective layer forming step of forming on the auxiliary layer a protective layer having carbon as a main component by chemical vapor deposition after the second heating step.

4. A method of manufacturing a perpendicular magnetic recording medium, the method comprising:

a main recording layer forming step of forming, on a substrate, at least a main recording layer formed of magnetic particles having a CoCrPt alloy as a main component and a non-magnetic grain boundary part having an oxide as a main component;

a split layer forming step of forming a split layer having a Co alloy, selected from the group consisting of RuCo, CoCr, CoCr—$SiO_2$ and CoCr—$TiO_2$, as a main component on the main recording layer;

a first heating step of performing a heat treatment on the substrate after the split layer forming step;

an auxiliary recording layer forming step of forming on the split layer an auxiliary recording layer formed of a material having CoCrPt as a main component after the first heating step;

a second heating step of performing a heat treatment on the substrate after the auxiliary recording layer forming step; and a protective layer forming step of forming on the auxiliary layer a protective layer having carbon as a main component by chemical vapor deposition after the second heating step, wherein when a sum of a heat quantity to be supplied to the substrate in the first heating step and a heat quantity to be supplied to the substrate in the second heating step is taken as a total heat quantity, the heat quantity at the time of the first heating step is 10% to 20% of the total heat quantity.

5. The method of manufacturing a perpendicular magnetic recording medium according to claim 1, wherein the split layer is non-magnetic.

6. The method of manufacturing a perpendicular magnetic recording medium according to claim 3, wherein the split layer is non-magnetic.

7. The method of manufacturing a perpendicular magnetic recording medium according to claim 1, wherein the split layer has some magnetism.

8. The method of manufacturing a perpendicular magnetic recording medium according to claim 3, wherein the split layer has some magnetism.

* * * * *